United States Patent
Nishio

(10) Patent No.: US 12,350,704 B2
(45) Date of Patent: Jul. 8, 2025

(54) COATING APPARATUS AND COATING METHOD

(71) Applicant: CHUGAI RO CO., LTD., Osaka (JP)

(72) Inventor: Tsutomu Nishio, Osaka (JP)

(73) Assignee: CHUGAI RO CO., LTD., Osaka (JP)

( * ) Notice: Subject to any disclaimer, the term of this patent is extended or adjusted under 35 U.S.C. 154(b) by 208 days.

(21) Appl. No.: 18/044,901

(22) PCT Filed: Aug. 20, 2021

(86) PCT No.: PCT/JP2021/030525
§ 371 (c)(1),
(2) Date: Mar. 10, 2023

(87) PCT Pub. No.: WO2022/070665
PCT Pub. Date: Apr. 7, 2022

(65) Prior Publication Data
US 2023/0271216 A1   Aug. 31, 2023

(30) Foreign Application Priority Data
Oct. 1, 2020   (JP) .................................. 2020-166795

(51) Int. Cl.
*B05C 5/02*   (2006.01)
*B05C 11/10*   (2006.01)
*B05D 1/26*   (2006.01)

(52) U.S. Cl.
CPC .......... *B05C 5/0258* (2013.01); *B05C 5/0225* (2013.01); *B05C 11/10* (2013.01); *B05D 1/26* (2013.01)

(58) Field of Classification Search
CPC ..... B05C 5/0258; B05C 5/0225; B05C 11/10; B05C 11/1007; B05C 5/0233;
(Continued)

(56) References Cited

U.S. PATENT DOCUMENTS 6,423,144 B1   7/2002   Watanabe
6,602,382 B1   8/2003   Matsuyama et al.
(Continued)

FOREIGN PATENT DOCUMENTS

CN   103596700   2/2014
EP   2711088   3/2014
(Continued)

OTHER PUBLICATIONS

Translation of JP '151 (Year: 2017).*
(Continued)

*Primary Examiner* — Michael G Miller
(74) *Attorney, Agent, or Firm* — Muncy, Geissler, Olds & Lowe, P.C.

(57) ABSTRACT

Provided is a coating apparatus where a coated object W is moved relative to an application nozzle 10 located above the coated object, and a coating liquid P is applied to a surface of the coated object via a slit-shaped discharge port 12 at a distal end of the application nozzle. In a coating liquid reservoir 11 storing the coating liquid therein, a coating liquid feeder 14 formed with a coating liquid holding recess 14a in a predetermined pattern shape is rotatably disposed at place above the slit-shaped discharge port. A partition member 13 for dividing the slit-shaped discharge port into plural discharge parts 12a along the longitudinal direction of the slit-shaped discharge port is disposed in the slit-shaped discharge port. The coating liquid feeder 14 is rotated to apply the coating liquid to the surface of the coated object via the discharge parts at places corresponding to the coating liquid holding recess.

7 Claims, 10 Drawing Sheets

(58) Field of Classification Search
CPC ......... B05C 5/0275; B05C 11/02; B05D 1/26; H01L 21/67017; H01L 21/6715
See application file for complete search history.

(56) References Cited

U.S. PATENT DOCUMENTS

| | | |
|---|---|---|
| 2003/0000464 A1 | 1/2003 | Puffe |
| 2013/0327269 A1 | 12/2013 | Sahara |
| 2018/0345309 A1* | 12/2018 | Rajala .................. B05C 5/0233 |

FOREIGN PATENT DOCUMENTS

| | | | |
|---|---|---|---|
| JP | S59-109273 | | 6/1984 |
| JP | H07-171486 A | | 7/1995 |
| JP | H07-326554 A | | 12/1995 |
| JP | H10-099764 A | | 4/1998 |
| JP | 2001-062368 A | | 3/2001 |
| JP | 2001-196301 A | | 7/2001 |
| JP | 2001-526114 A | | 12/2001 |
| JP | 2002-320902 A | | 11/2002 |
| JP | 2005-028227 A | | 2/2005 |
| JP | 2008-194588 A | | 8/2008 |
| JP | 2009-290029 A | | 12/2009 |
| JP | 2010-253328 A | | 11/2010 |
| JP | 2012-120938 A | | 6/2012 |
| JP | 2013-054128 A | | 3/2013 |
| JP | 2014-022545 A | | 2/2014 |
| JP | 2017109151 A | * | 6/2017 |
| WO | WO-2013065470 A1 | * | 5/2013 ......... H01L 21/6715 |

OTHER PUBLICATIONS

Translation of WO '470 (Year: 2013).*
International Preliminary Report on Patentability of the corresponding International application No. PCT/JP2021/030525 issued Mar. 28, 2023 and English translation thereof.
Office Action of the corresponding CN application No. 202111150275 mailed Jun. 27, 2023.
Office Action of the corresponding CN application No. 202111150275 mailed Jun. 27, 2023 and English translation thereof.
Office Action of the corresponding CN application No. 202111150275 mailed Jan. 24, 2024 and English machine translation thereof.
The extended European Search Report dated Nov. 22, 2024 issued in the corresponding European Patent Application No. 21874968.7.

* cited by examiner

COATING APPARATUS AND COATING METHOD

TECHNICAL FIELD

The present invention relates to a coating apparatus and a coating method for applying a coating liquid to a surface of a coated object by using the coating apparatus. The coating apparatus includes: a coating liquid reservoir for storing the coating liquid in an application nozzle; and a slit-shaped discharge port disposed at a distal end of the application nozzle and discharging the coating liquid from the coating liquid reservoir. In addition, the coating apparatus causes relative movement between the coated object and the application nozzle while positioning the slit-shaped discharge port at place above the coated object, so as to apply the coating liquid to a surface of the coated object via the above-described slit-shaped discharge port. More particularly, the invention is characterized in that when applying the coating liquid to the surface of the coated object via the slit-shaped discharge port disposed in the application nozzle by causing the relative movement between the coated object and the application nozzle, the coating apparatus is adapted to uniformly apply the coating liquid to the surface of the coated object without producing coat thickness variations and the like, and to easily and correctly apply the coating liquid in a variety of shapes such as circle.

BACKGROUND ART

Heretofore, a variety of methods have been used for applying the coating liquid in a predetermined shape on the surface of a coated object by means of the coating apparatus. A variety of coating apparatus for this purpose have been known in the art. By way of example, a coating apparatus is configured to locate the application nozzle, the distal end of which includes the slit-shaped discharge port for discharging of the coating liquid, at place above the coated object, and to cause the relative movement between the application nozzle and the coated object so as to apply the coating liquid to the surface of the coated object via the slit-shaped discharge port.

As disclosed in Patent Document 1, for example, a spin coater is known as a machine for circularly applying the coating liquid to the surface of a circular coated object such as wafer. The circular coated object is placed on a rotatable turntable, which is rotated. The coating liquid is applied from the nozzle to a central part of the coated object being spun, so that the coating liquid is applied over the surface of the coated object by means of a centrifugal force of the coated object being spun.

According to the spin coater such as disclosed in Patent Document 1, however, it is difficult to apply the coating liquid in a manner to form a layer of a uniform thickness over the surface of the coated object being spun. Furthermore, the coating liquid applied to the surface of the coated object being spun is centrifugally flung away from the coated object, resulting in the waste of the coating liquid. In the case of a particularly expensive coating liquid, there is a problem about an increased cost of the wasted coating liquid.

Another coater is disclosed in Patent Document 2 as follows. A circular coated object is set on a turntable, which is rotated. Meanwhile, the coating liquid is spirally applied to the surface of the coated object being spun by gradually moving the coating liquid feeding nozzle from the center of the coated object to an outer peripheral side thereof. Thus, the coating liquid is applied to the circular surface of the coated object being spun.

As disclosed in Patent Document 2, the nozzle for applying the coating liquid to the surface of the coated object being spun is gradually moved from the center of the coated object to the outer peripheral side so as to spirally apply the coating liquid to the surface of the coated object being spun. In this case, it takes a long time to apply the coating liquid to the surface of the coated object having a circular shape. This results in poor productivity. Furthermore, it is difficult to apply the coating liquid in a uniform thickness to the surface of the coated object.

As disclosed in Patent Document 3, a coating apparatus includes: a turntable capable of turning at least through 180° as carrying a coated object thereon; a plurality of nozzles for discharging resin arranged along one of the arcs equivalent to a first circumferential region and a second circumferential region of the coated object which are defined by dividing the coated object into halves by a first direction axis (X direction) passing through the center of the coated object; a resin film forming head where the above-described nozzles are arranged as opposed to the circumferential region of the coated object; and a transfer mechanism for relative movement of the coated object and the resin film forming head in a second direction (Y direction) orthogonal to the first direction. The above-described transfer mechanism controls the transfer of the resin film forming head. Furthermore, a mechanism for discretely controlling a discharge width of the coating liquid from each of the nozzles by discretely controlling the discharge and discharge stop of the coating liquid from each of the nozzles is used so as to apply the coating liquid to the surface of the circular coated object.

In order to apply the coating liquid to the surface of the circular coated object as taught in Patent Document 3, however, the following problems, for example, may be encountered. The device has a complicated configuration and hence, has difficulty in controlling the device. The device suffers increased costs for applying the coating liquid to the surface of the circular coated object and cumbersome control operations of the device. The coating liquid cannot be easily applied to the surface of the circular coated object. It is also difficult to apply the coating liquid to the surface of the coated object in the uniform thickness.

Patent Document 4 discloses the following configuration. A long nozzle body includes: a cylindrical cavity extended in a longitudinal direction of the nozzle; a slit-shaped discharge port extended in the longitudinal direction of the nozzle; and a land part forming a chemical liquid passage extended from the cavity to the discharge port. A cylindrical rotary manifold for storing the coating liquid is rotatably fitted in the cavity. The coating liquid fed from the coating liquid feeder is stored in the rotary manifold. One end of the rotary manifold is closed, while an opening of a shape corresponding to that of a coated area of the coated object is formed through an outer periphery of this rotary manifold.

According to the device disclosed in Patent Document 4, the nozzle body is moved relative to the coated object to which the coating liquid is applied. Meanwhile, the rotary manifold fed with the coating liquid is rotated in the cavity so as to bring the opening formed through the outer periphery thereof to position corresponding to the slit-shaped discharge port. From the opening formed through the outer periphery of the rotary manifold via the slit-shaped discharge port, the coating liquid is fed to the surface of the coated object. Thus, the coating liquid is applied to the surface of the coated object according to a shape corresponding to that of the opening formed through the outer periphery of the rotary manifold.

As pointed out in Patent Document 4, however, the following problem may be encountered. According to the device, the coating liquid is fed into and stored in the cylindrical rotary manifold rotatably fitted in the cavity of the nozzle body. The rotary manifold storing the coating liquid therein is rotated in the cavity so as to bring the opening formed through the outer periphery thereof to the position corresponding to the slit-shaped discharge port of the nozzle body. Thus, the coating liquid stored in the rotary manifold is applied to the surface of the coated object from the above-described opening via the slit-shaped discharge port. In this case, the coating liquid stored in the rotary manifold may be excessively applied to the surface of the coated object from the opening formed through the manifold via the slit-shaped discharge port. This makes it difficult to apply the coating liquid in a uniform thickness on the surface of the coated object. Furthermore, the coating liquid in the rotary manifold may flow through the opening formed therein and into a gap between the rotary manifold and the cavity. Thus, the coating liquid may flow through the slit-shaped discharge port, dripping onto the surface of the coated object. What is more, the coating liquid stored in the rotary manifold may not be evenly used so that some of the stored coating liquid may suffer density variations or viscosity variations, resulting in defective coating.

The device disclosed in Patent Document 5 is also configured just as the device disclosed in the foregoing Patent Document 4. That is, the coating liquid is stored in an inner cylinder part and is applied to the surface of the coated object via an area where the outer peripheral opening overlaps with the discharge port. Hence, this device suffers the same problems as those described in Patent Document 4.

CITATION LIST

Patent Documents

Patent Document 1: JPA 2009-290029
Patent Document 2: JPA 2002-320902
Patent Document 3: JPA 2013-54128
Patent Document 4: JPA 2014-22545
Patent Document 5: JPA 2012-120938

DISCLOSURE OF INVENTION

Technical Problem

An object of the invention is to solve the above-described various problems encountered when applying a coating liquid onto a surface of a coated object according to a predetermined shape.

That is, the object of the invention is to provide an easy and accurate application of the coating liquid onto the surface of the coated object in any of various shapes in a manner to obviate coat thickness variations and the like on the surface of the coated object when the coating liquid is applied to the surface of the coated object via the slit-shaped discharge port by locating an application nozzle, a distal end of which includes a slit-shaped discharge port for discharging the coating liquid, at place above the coated object, and causing the relative movement between the coated object and the application nozzle.

Solution to Problem

According to an aspect of the invention for achieving the above object, a coating apparatus includes: a coating liquid reservoir for storing of a coating liquid in an application nozzle; and a slit-shaped discharge port disposed at a distal end of the application nozzle and discharging the coating liquid from the coating liquid reservoir, wherein with the slit-shaped discharge port located at place above a coated object, a relative movement between the application nozzle and the coated object is caused to apply the coating liquid to a surface of the coated object via the slit-shaped discharge port, and has a configuration wherein, a coating liquid feeder an outer periphery of which is formed with a coating liquid holding recess having a predetermined pattern shape for holding the coating liquid therein is rotatably disposed in the coating liquid reservoir in a manner to be located at place above the slit-shaped discharge port, a partition member for dividing the slit-shaped discharge port into plural discharge parts along a longitudinal direction of the slit-shaped discharge port is disposed, while causing the relative movement between the coated object and the application nozzle, the coating liquid feeder with the coating liquid holding recess holding the coating liquid therein is rotated in the coating liquid reservoir, so that the coating liquid held in the coating liquid holding recess is discharged to a surface of the coated object via some discharge parts at positions corresponding to the coating liquid holding recess moved to the slit-shaped discharge port of the application nozzle and thus, the coating liquid is applied to the surface of the coated object in a manner to correspond to a shape of the coating liquid holding recess.

As suggested by the coating apparatus according to the invention, the coating liquid feeder, the outer periphery of which is formed with the coating liquid holding recess of the predetermined pattern shape for holding the coating liquid therein is rotated in the coating liquid reservoir as located above the slit-shaped discharge port. The coating liquid feeder with the coating liquid held in the coating liquid holding recess is rotated at place above the slit-shaped discharge port while the relative movement between the coated object and the application nozzle is caused. Then, the coating liquid holding recess of the coating liquid feeder is so located as to be communicated with the slit-shaped discharge port. In this state, the coating liquid in the coating liquid holding recess flows through the slit-shaped discharge port at the distal end of the application nozzle and is fed onto the surface of the coated object moved relative to the application nozzle. Thus, the coating liquid is applied to the surface of the coated object according to the shape of the coating liquid holding recess.

The following advantage is offered if the partition member for dividing the slit-shaped discharge port into the plural discharge parts along the longitudinal direction of the slit-shaped discharge port is used as suggested by the coating apparatus according to the invention. If some unapplied coating liquid remains in the slit-shaped discharge port when the coating liquid in the coating liquid holding recess of the coating liquid feeder is applied to the surface of the coated object via the slit-shaped discharge port, as described above, the coating liquid in the coating liquid holding recess is allowed to flow only into the discharge parts at positions corresponding to the coating liquid holding recess. That is, the coating liquid is applied to the surface of the coated object only through the discharge parts to which the coating liquid is allowed to flow. Thus is prevented the problem that the coating liquid flows into the other parts at the slit-shaped discharge port so that the coating liquid is drawn from many discharge parts other than those corresponding to the coating liquid holding recess and applied to the surface of the coated object. As a result, the coating liquid is accurately applied to the surface of the coated object according to the shape of the coating liquid holding recess.

According to the coating apparatus of the invention, the slit-shaped discharge port is divided into the plural discharge parts along the longitudinal direction of the slit-shaped discharge port by disposing the partition member in the slit-shaped discharge port. As for this, it is preferred to insert the corrugated partition member, which has a continuous wave pattern, along the longitudinal direction of the slit-shaped discharge port so that the plural discharge parts are alternately arranged on either side of the slit-shaped discharge port with respect to the width direction thereof. If the corrugated partition member is used to alternately arrange the plural discharge parts on either side of the slit-shaped discharge port with respect to the width direction thereof, the following advantage is obtained. At each position with respect to the longitudinal direction of the slit-shaped discharge port, a total width of the discharge parts on the either side of the slit-shaped discharge port substantially becomes constant. When the coating liquid in the coating liquid holding recess is applied to the surface of the coated object via the discharge parts corresponding to the holding recess, a constant amount of coating liquid is fed via the respective discharge parts at each position with respect to the longitudinal direction of the slit-shaped discharge port. Therefore, a constant amount of coating liquid is applied to the surface of the coated object so that coat thickness variations are prevented.

According to the coating apparatus of the invention, the partition member for dividing the slit-shaped discharge port into the plural discharge parts along the longitudinal direction of the slit-shaped discharge port is disposed. In this case, it is preferred that the partition member has a shorter length than the slit-shaped discharge port with respect to a discharge direction of the slit-shaped discharge port. If the partition member is shorter than the slit-shaped discharge port with respect to the discharge direction, the partition member does not exist at an end of the slit-shaped discharge port with respect to the discharge direction. Hence, the slit-shaped discharge port has a continuous end with respect to the discharge direction. Thus, the coating liquid led from the coating liquid holding recess into the discharge parts at the corresponding positions flows over the discharge parts separated by the partition member and into the continuous slit-shaped discharge port at the end with respect to the discharge direction. Thus, the coating liquid is applied to the surface of the coated object. Accordingly, the coating liquid is uniformly applied to the surface of the coated object without producing streaks corresponding to the partition member. It is noted that the continuous slit-shaped discharge part at the end in the discharge direction has such a small length in the discharge direction that the coating liquid is not drawn from many discharge parts other than those corresponding to the coating liquid holding recess.

According to the coating apparatus of the invention, it is preferred that a pressure regulator is provided for regulating the pressure on the coating liquid in the coating liquid reservoir. In a state where the pressure on the coating liquid in the coating liquid reservoir is maintained at a given level by means of the pressure regulator, the above-described coating liquid feeder is rotated to discharge the coating liquid in the coating liquid holding recess onto the surface of the coated object via the discharge parts at positions corresponding to the coating liquid holding recess. This approach offers an advantage as follows. When the coating liquid in the coating liquid holding recess is discharged onto the surface of the coated object via the discharge parts at positions corresponding to the coating liquid holding recess moved to the slit-shaped discharge port of the application nozzle, the coating liquid in the coating liquid holding recess is discharged onto the surface of the coated object via the discharge parts of the slit-shaped discharge port under the constant pressure. Hence, the coating liquid is applied to the surface of the coated object in the uniform thickness.

As the above-described pressure regulator of the coating apparatus according to the invention, a gas feed regulator can be used which controls the pressure on the coating liquid fed into the above-described coating liquid reservoir to be at the given level by feeding a gas into the coating liquid reservoir in a state where the coating liquid is fed into the above-described coating liquid reservoir. Otherwise, a coating liquid feed regulator can also be used which fills the coating liquid in the coating liquid reservoir and regulates the feed of the coating liquid into the coating liquid reservoir so as to control the pressure on the coating liquid fed in the coating liquid reservoir to be at the given level.

According to the coating apparatus of the invention, the coating liquid holding recess is formed in the outer periphery of the coating liquid feeder in an axially elongated elliptical shape. The relative movement between the coated object and the application nozzle is performed at a speed higher than a circumferential speed at which the coating liquid feeder is rotated. In this manner, the coating liquid can be circularly applied to the surface of the coated object. This approach allows the coating liquid to be circularly applied to the surface of a circular coated object such as wafer. Furthermore, the coating liquid feeder formed with the coating liquid holding recess can be reduced in diameter. Therefore, the application nozzle can be downsized.

A coating method according to an aspect of the invention uses the above-described coating apparatus and includes the steps of: feeding the coating liquid into the coating liquid reservoir in a state where the slit-shaped discharge port at the distal end of the application nozzle is closed with a part of the coating liquid feeder that is not formed with the coating liquid holding recess of the coating liquid feeder rotatably disposed in the coating liquid reservoir; allowing the coating liquid holding recess to hold some coating liquid therein, the coating liquid holding recess formed in the outer periphery of the coating liquid feeder in the predetermined pattern shape, the coating liquid feeder rotatably disposed in the coating liquid reservoir; causing the relative movement between the application nozzle and the coated object while rotating the coating liquid feeder in the coating liquid reservoir along with the coating liquid holding recess holding some coating liquid therein; allowing the coating liquid holding recess to discharge the coating liquid of the coating liquid holding recess onto the surface of the coated object via the discharge parts brought to place corresponding to the slit-shaped discharge port of the application nozzle; and thus applying the coating liquid to the surface of the coated object according to the shape of the coating liquid holding recess.

According to this method, the slit-shaped discharge port in the application nozzle is closed with the part of the coating liquid feeder that is not formed with the coating liquid holding recess. Hence, the coating liquid fed into the coating liquid reservoir does not leak out through the slit-shaped discharge port. When the coating liquid feeder with some coating liquid held in the coating liquid holding recess is rotated in the coating liquid reservoir while performing the relative movement between the coated object and the application nozzle, the coating liquid held in the coating liquid holding recess is discharged to the surface of the coated object via the discharge parts at positions corresponding to the coating liquid holding recess moved to the slit-shaped discharge port of the application nozzle. Thus, the coating liquid is applied to the surface of the coated object according to the shape of the coating liquid holding recess.

Advantageous Effects of Invention

In the coating apparatus according to the invention, the coating liquid feeder, the outer periphery of which is formed with the coating liquid holding recess in the predetermined pattern shape for holding some coating liquid as described above, is rotatably disposed in the coating liquid reservoir in the application nozzle. The coating liquid feeder is adapted to rotate at place above the slit-shaped discharge port. The coating liquid feeder with some coating liquid held in the coating liquid holding recess is rotated at place above the slit-shaped discharge port. Further, the coated object and the application nozzle are relatively moved to each other. In a state where the coating liquid holding recess of the above-described coating liquid feeder is brought to position to be communicated with the slit-shaped discharge port, the coating liquid held in the coating liquid holding recess is fed onto the surface of the coated object moved relative to the application nozzle via the slit-shaped discharge port at the distal end of the application nozzle. Thus, the coating liquid is properly applied to the surface of the coated object according to the shape of the coating liquid holding recess.

The coating apparatus according to the invention is provided with the partition member for dividing the slit-shaped discharge port into the plural discharge parts along the longitudinal direction of the slit-shaped discharge port. Even though some unapplied coating liquid remains in the slit-shaped discharge port when the coating liquid in the coating liquid holding recess of the coating liquid feeder is applied to the surface of the coated object via the slit-shaped discharge port, the coating liquid in the coating liquid holding recess is allowed to flow only to the discharge parts corresponding to coating liquid holding recess. Hence, the coating liquid is fed onto the surface of the coated object only through the discharge parts to which the coating liquid is allowed to flow. The coating liquid is prevented from flowing to the other parts in the slit-shaped discharge port, being drawn by many parts other than those corresponding to the coating liquid holding recess and fed onto the surface of the coated object. Thus, the coating liquid is accurately applied onto the surface of the coated object according to the shape of the coating liquid holding recess.

BEST MODE FOR CARRYING OUT THE INVENTION

The coating apparatus and coating method according to embodiments of the invention will hereinbelow be described with reference to the accompanying drawings. It is to be understood that the invention is not limited to the following embodiments but may include a variety of exemplary modifications so long as such modifications do not depart from the scope of the invention.

Figure 1A:
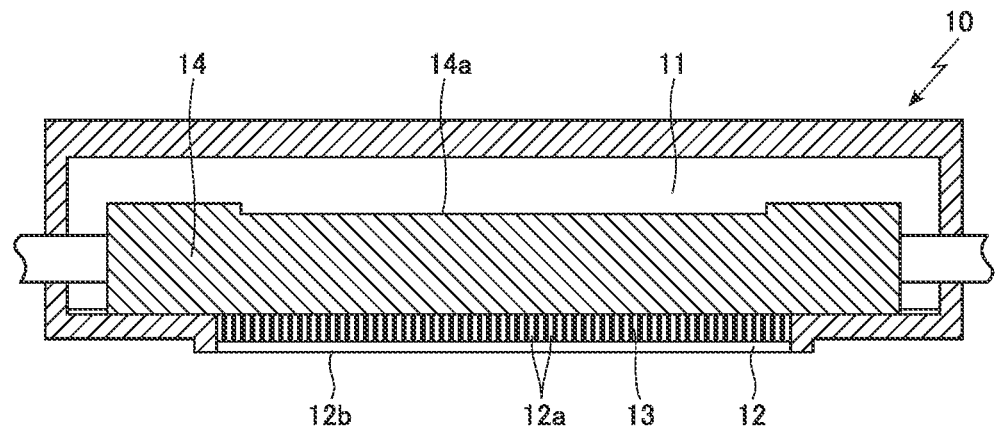
FIG. 1A shows a coating apparatus according to an embodiment of the invention where a coating liquid feeder provided with an elliptically shaped coating liquid holding recess for holding some coating liquid therein is rotatably disposed in the coating liquid reservoir in a manner to be located above the slit-shaped discharge port at a distal end of the application nozzle, and a corrugated partition member is disposed in the above-described slit-shaped discharge port in a manner to extend along a longitudinal direction of the slit-shaped discharge port, and is a schematic longitudinal sectional illustration of an application nozzle.
Figure 1B:
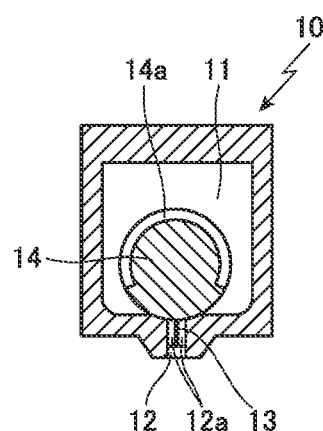
FIG. 1B shows the coating apparatus according to the embodiment of the invention where the coating liquid feeder provided with the elliptically shaped coating liquid holding recess for holding some coating liquid therein is rotatably disposed in the coating liquid reservoir in a manner to be located above the slit-shaped discharge port at the distal end of the application nozzle, and the corrugated partition member is disposed in the above-described slit-shaped discharge port in a manner to extend along the longitudinal direction of the slit-shaped discharge port, and is a schematic sectional illustration of the application nozzle taken in a direction intersecting with the longitudinal direction of the application nozzle.
Figure 1C:
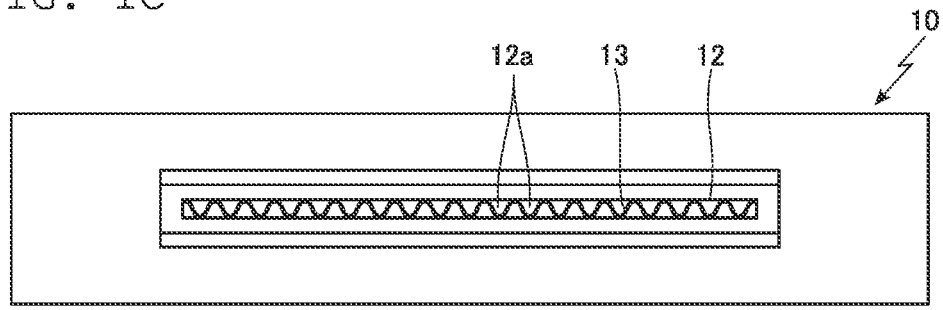
FIG. 1C shows the coating apparatus according to the embodiment of the invention where the coating liquid feeder provided with the elliptically shaped coating liquid holding recess for holding some coating liquid therein is rotatably disposed in the coating liquid reservoir in a manner to be located above the slit-shaped discharge port at the distal end of the application nozzle, and the corrugated partition member is disposed in the above-described slit-shaped discharge port in a manner to extend along the longitudinal direction of the slit-shaped discharge port, and a schematic bottom view of the application nozzle provided with the corrugated partition member as seen from a distal end of the application nozzle.

In the coating apparatus according to an embodiment of the invention, as shown in FIG. 1A to FIG. 1C, a coating liquid reservoir 11 for storing a coating liquid P is disposed in an application nozzle 10. Further, a slit-shaped discharge port 12 for discharging the coating liquid P is disposed at a distal end of the application nozzle 10 in a manner to be communicated with the coating liquid reservoir 11.

In the coating apparatus according to the embodiment, a corrugated partition member 13, which has a continuous wave shape, shorter than the slit-shaped discharge port 12 in a discharge direction is longitudinally disposed in the slit-shaped discharge port 12. As located at place thus defined, the partition member 13 longitudinally divides the slit-shaped discharge port 12 into a plurality of discharge parts 12a. On the other hand, a distal end of the slit-shaped discharge port 12 with respect to the discharge direction defines a longitudinally continuous slit-shaped discharge part 12b, which is a single longitudinally continuous hollow space and extends in the longitudinal direction, is created between a distal edge of the partition member and a distal edge of the slit-shaped discharge port in the discharge direction. According to this embodiment, the corrugated partition member 13 is shorter than the slit-shaped discharge port 12 with respect to the discharge direction so as to define the continuous slit-shaped discharge part 12b where the slit-shaped discharge port 12 has a continuous end at the distal end of the slit-shaped discharge port 12 with respect to the discharge direction. However, the corrugated partition member 13 may also have the same length as that of the slit-shaped discharge port 12 with respect to the discharge direction.

Figure 2A:
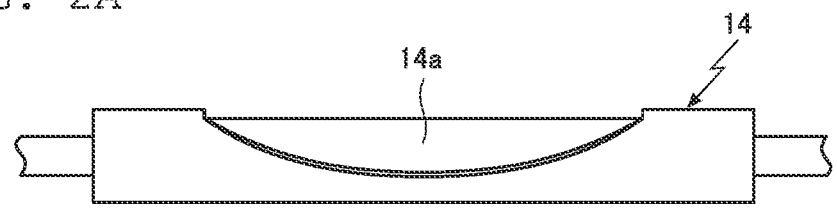
FIG. 2A shows a coating liquid feeder for use in the coating apparatus according to the above embodiment, and is a schematic front view of the coating liquid feeder provided with the elliptically shaped coating liquid holding recess in an outer periphery thereof.
Figure 2B:
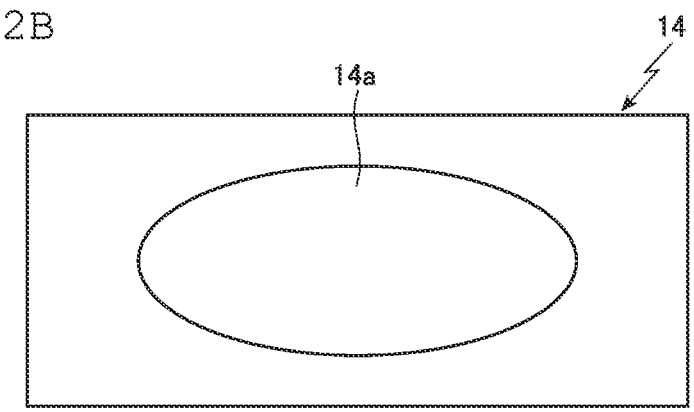
FIG. 2B shows a coating liquid feeder for use in the coating apparatus according to the above embodiment, and is a schematic developed plan of the coating liquid holding recess formed in the outer periphery of the coating liquid feeder.

As shown in FIG. 2A and FIG. 2B, a coating liquid feeder 14 is made of a rod-shaped cylindrical body, an outer periphery of which is formed with a coating liquid holding recess 14a in an axially elongated elliptical shape. In the application nozzle 10, the coating liquid feeder 14 is rotatably disposed in the coating liquid reservoir 11 so as to locate the coating liquid holding recess 14a at place above the slit-shaped discharge port 12. The coating liquid feeder 14 is also adapted to shut down the communication between the slit-shaped discharge port 12 and the coating liquid reservoir 11 by placing a part of the coating liquid feeder 14 that is not formed with the coating liquid holding recess 14a on the slit-shaped discharge port 12.

Figure 3A:
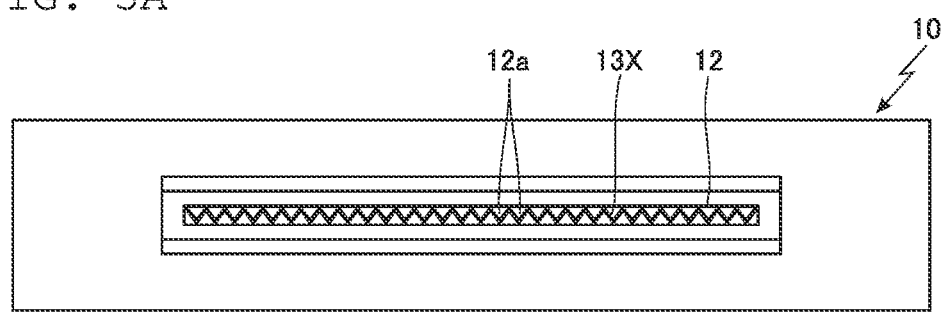
FIG. 3A shows an exemplary modification of the partition member longitudinally disposed in the slit-shaped discharge port, and is a schematic bottom view of the partition member, as seen from the distal end of the application nozzle, the partition member extended in a zigzag manner along the longitudinal direction of the slit-shaped discharge port.
Figure 3B:
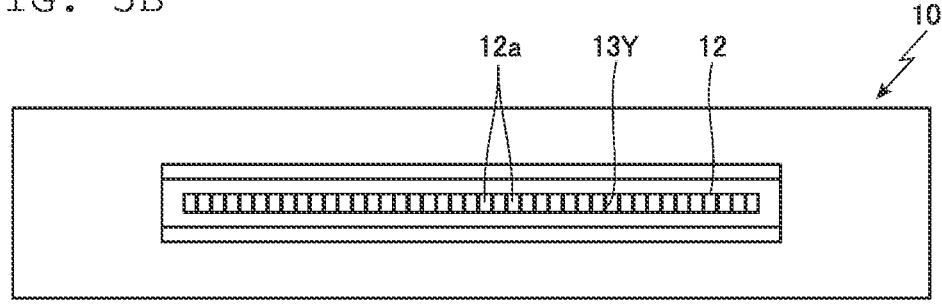
FIG. 3B shows an exemplary modification of the partition member longitudinally disposed in the slit-shaped discharge port, and is a schematic bottom view of a partition member, as seen from the distal end of the slit-shaped discharge port, the partition member having a comb-teeth configuration arranged along the longitudinal direction of the slit-shaped discharge port.

According to this embodiment, the partition member 13 having a round wave pattern as described above is disposed along the longitudinal direction of the slit-shaped discharge port 12. However, the partition member 13 is not limited to this configuration. As shown in FIG. 3A, for example, a partition member 13X having a linear wave pattern that is a zigzag pattern can be disposed along the longitudinal direction of the slit-shaped discharge port 12 so as to longitudinally divide the slit-shaped discharge port 12 into a plurality of discharge parts 12a. As shown in FIG. 3B, a partition member 13Y having a comb teeth pattern may be disposed along the longitudinal direction of the slit-shaped discharge port 12 so as to longitudinally divide the slit-shaped discharge port 12 into the multiple discharge parts 12a. While a graphic illustration is omitted, it is also possible to adopt a partition member where plural discharge holes are arranged in a width direction of the slit-shaped discharge port 12 along the longitudinal direction of the slit-shaped discharge port 12.

First Embodiment of Coating Apparatus

Next, a specific description is made on a coating apparatus according to a first embodiment hereof.

Figure 4:
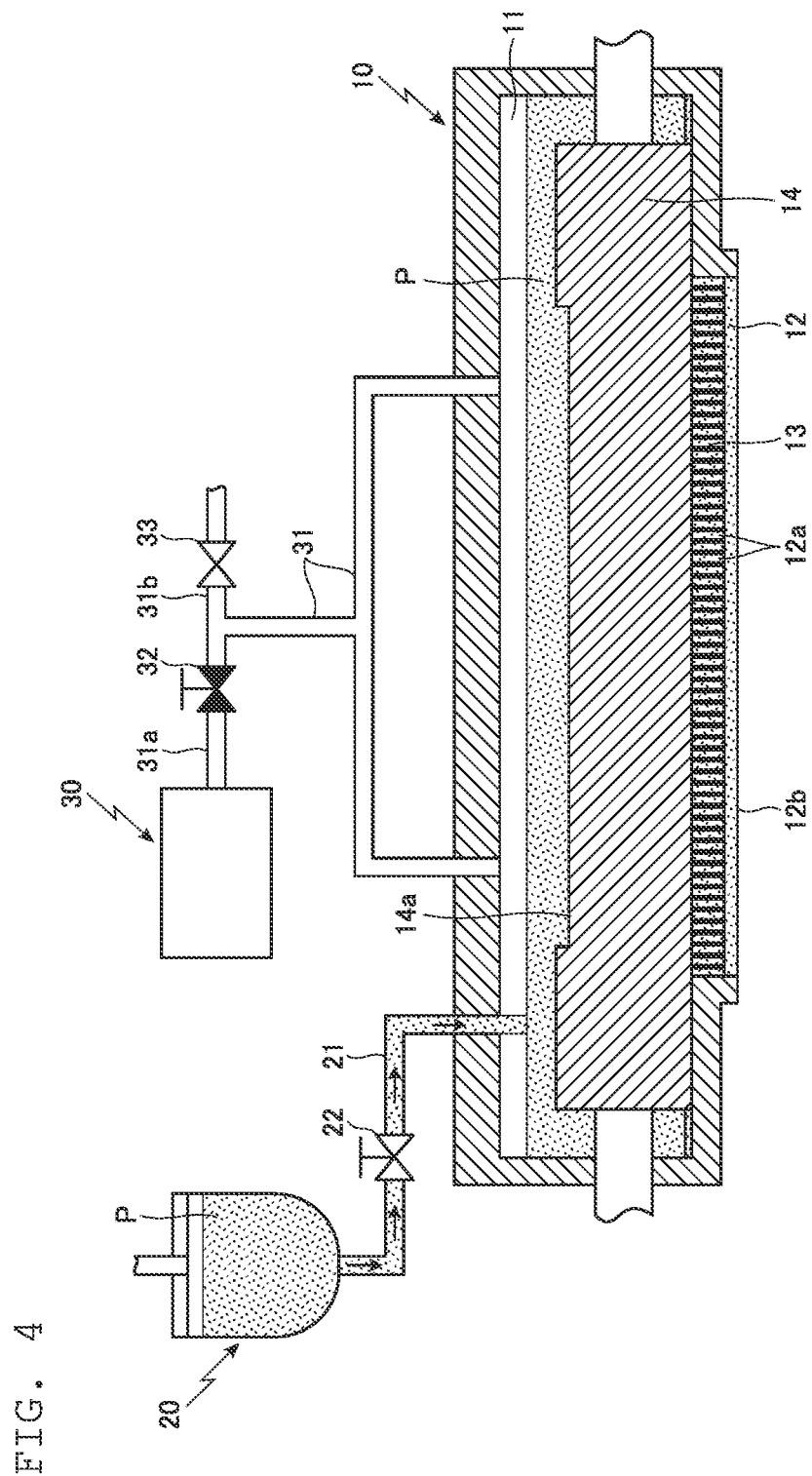
FIG. 4 is a schematic longitudinal sectional illustration of the application nozzle of the coating apparatus according to the first embodiment hereof, showing how the coating liquid is supplied from a coating liquid feed device into the coating liquid reservoir via a coating liquid feed pipe in a state where an upper side of the slit-shaped discharge port is closed with a portion of the coating liquid feeder that is not formed with the coating liquid holding recess.

In the coating apparatus according to the first embodiment, as shown in FIG. 4 and the like, a coating liquid feed valve 22 is disposed in a coating liquid feed pipe 21 for feeding the coating liquid P from a coating liquid feed device 20 to the coating liquid reservoir 11 in the application nozzle 10. The coating liquid feed valve 22 is opened or closed to feed the coating liquid P to the coating liquid reservoir 11 or to stop the feed of the coating liquid. There is provided a gas feed/exhaust pipe 31 for feeding/exhausting gas to/from the coating liquid reservoir 11. As gas feed regulation means, a gas feed regulation valve 32 for regulating the feed of gas from a gas feed device 30 to the coating liquid reservoir 11 is disposed in a feed side pipe 31a of the gas feed/exhaust pipe 31. An exhaust valve 33 is disposed in an exhaust side pipe 31b of the gas feed/exhaust pipe 31 so as to exhaust the gas from the coating liquid reservoir 11 via the exhaust valve 33. As seen in FIG. 4 and the like, the coating liquid P exists in an area of the slit-shaped discharge port 12 at the distal end of the application nozzle 10. This is because the coating liquid P fed to the slit-shaped discharge port 12 of the application nozzle 10 is accumulated there when the coating apparatus is in operation or in a preparatory step for test run and the like.

Figure 5:
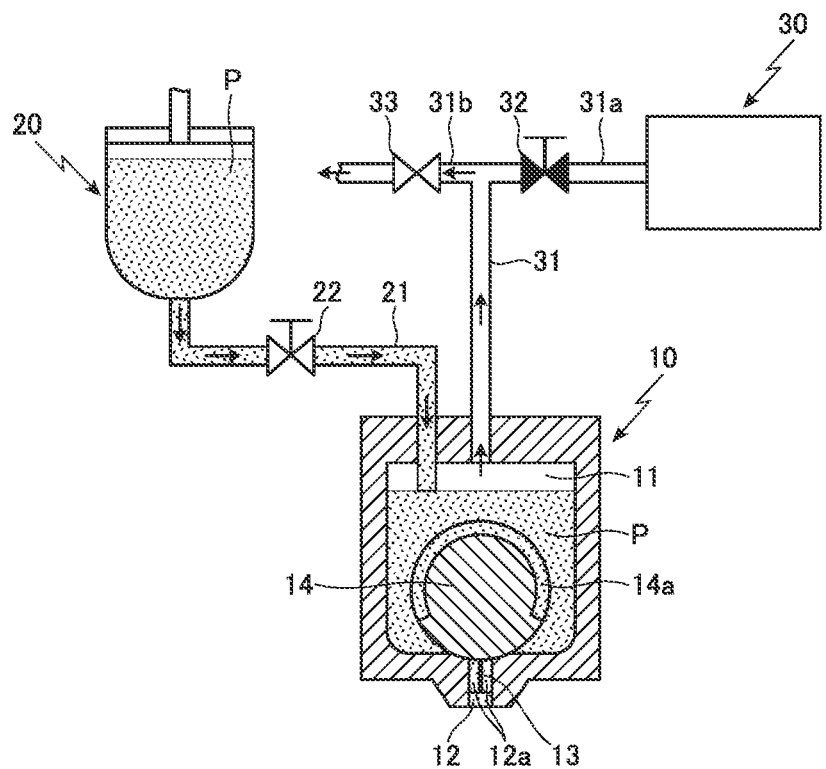
FIG. 5 is a schematic sectional illustration of the coating apparatus according to the first embodiment hereof as seen in a direction intersecting with the longitudinal direction of the application nozzle, showing a state where the coating liquid is fed from the coating liquid feed device to the coating liquid reservoir via the coating liquid feed pipe in a state where the upper side of the slit-shaped discharge port is closed with the portion of the coating liquid feeder that is not formed with the coating liquid holding recess.

In a case where the coating liquid P is fed into the coating liquid reservoir 11 in the application nozzle 10 of the coating apparatus of the first embodiment, the coating liquid feeder 14 has its portion not formed with the coating liquid holding recess 14a placed on the slit-shaped discharge port 12 at the distal end of the application nozzle 10 so as to close the communication between the coating liquid reservoir 11 and the slit-shaped discharge port 12, as shown in FIG. 4 and FIG. 5. In this state, the coating liquid feed valve 22 in the coating liquid feed pipe 21 is opened to feed a predetermined amount of coating liquid P from the coating liquid feed device 20 to the coating liquid reservoir 11 via the coating liquid feed pipe 21. Meanwhile, the exhaust valve 33 in the exhaust side pipe 31b is opened to exhaust the gas from the coating liquid reservoir 11 through the exhaust side pipe 31b (gas purging). On the other hand, the gas feed regulation valve 32 in the feed side pipe 31a is closed to inhibit the gas feed from the gas feed device 30 to the coating liquid reservoir 11. As to the open and close of the coating liquid feed valve 22, the gas feed regulation valve 32 and the exhaust valve 33, a blank mark indicates the open state, and a solid black mark indicates the closed state.

Figure 6:
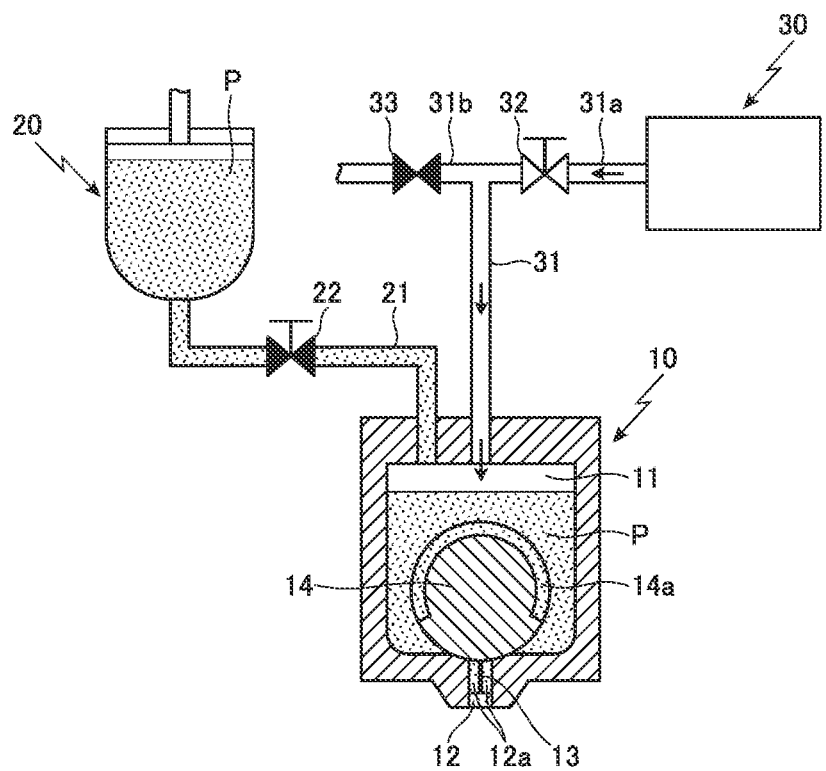
FIG. 6 is a schematic sectional illustration of the coating apparatus according to the first embodiment hereof as seen in the direction intersecting with the longitudinal direction of the application nozzle, showing a state where, after the coating liquid is fed from the coating liquid feed device to the coating liquid reservoir via the coating liquid feed pipe as shown in FIG. 5, a gas is fed into the coating liquid reservoir so as to regulate the pressure on the coating liquid in the coating liquid reservoir to be at the given level.

After the predetermined amount of coating liquid P is fed into the coating liquid reservoir 11 of the application nozzle 10 as described above, the slit-shaped discharge port 12 is closed by means of the portion of the coating liquid feeder 14 that is not formed with the coating liquid holding recess 14a, as shown in FIG. 6. In this state, the coating liquid feed valve 22 in the coating liquid feed pipe 21 is closed to inhibit the feed of the coating liquid P from the coating liquid feed device 20 to the coating liquid reservoir 11. Furthermore, the exhaust valve 33 disposed in the exhaust side pipe 31b is closed to inhibit the gas exhaust from the coating liquid reservoir 11. On the other hand, the gas feed regulation valve 32 in the feed side pipe 31a is opened to feed the gas from the gas feed device 30 to the coating liquid reservoir 11 via the gas feed regulation valve 32 disposed in the feed side pipe 31a. Thus, the pressure on the coating liquid P in the coating liquid reservoir 11 is so controlled to be at the given level.

Figure 7A:
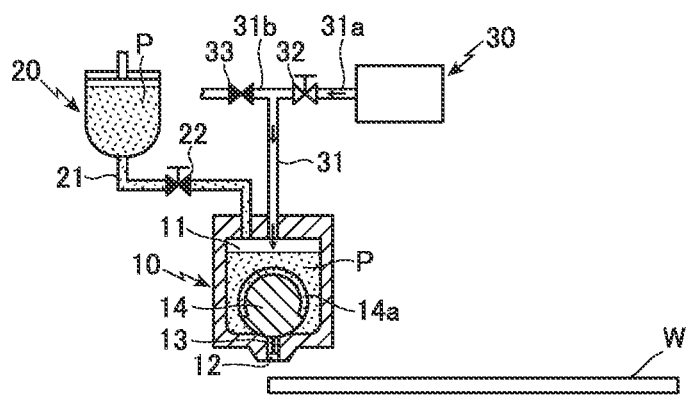
FIG. 7A is a schematic sectional illustration of the coating apparatus according to the first embodiment hereof, and shows a step of locating the application nozzle at place above a circular coated object in an operation of applying the coating liquid to the surface of the coated object in a state where a pressure on the coating liquid in the coating liquid reservoir is regulated by feeding a gas into the coating liquid reservoir supplied with a predetermined amount of the coating liquid.

According to the coating apparatus of the first embodiment, the above-described application nozzle 10 applies the coating liquid P onto the surface of a coated object W, as follows. The slit-shaped discharge port 12 at the distal end of the application nozzle 10 is closed by means of the part of the coating liquid feeder 14 that is not formed with the coating liquid holding recess 14a. The gas feed device 30 feeds the gas into the coating liquid reservoir 11 via the gas feed regulation valve 32 so that the pressure on the coating liquid P in the coating liquid reservoir 11 is controlled to be at the given level. In this state, as shown in FIG. 7A, the application nozzle 10 is moved to a position to start to apply the coating liquid P onto the surface of the coated object W from the slit-shaped discharge port.

Figure 7B:
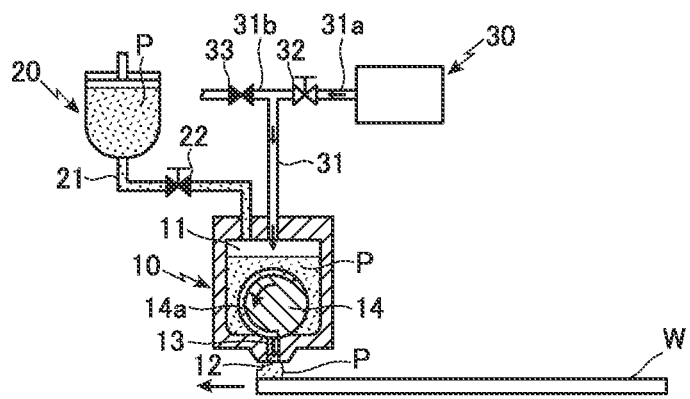
FIG. 7B is a schematic sectional illustration of the coating apparatus according to the first embodiment hereof, and shows a step of rotating the above-described coating liquid feeder to bring the elliptically shaped coating liquid holding recess formed in an outer periphery of the coating liquid feeder to the place above the slit-shaped discharge port in the operation of applying the coating liquid to the surface of the coated object in the state where the pressure on the coating liquid in the coating liquid reservoir is regulated by feeding the gas into the coating liquid reservoir supplied with the predetermined amount of the coating liquid.
Figure 7C:
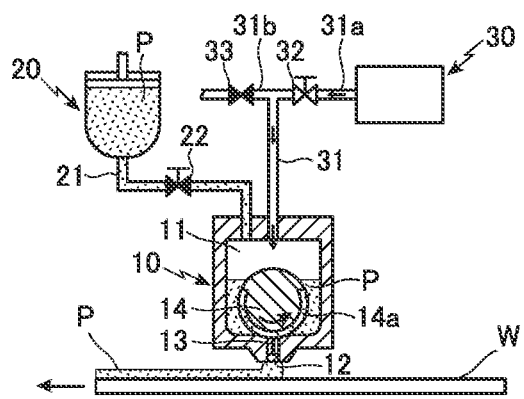
FIG. 7C is a schematic sectional illustration of the coating apparatus according to the first embodiment hereof, and shows a step of allowing the coating liquid to move to the discharge parts through a communication between the coating liquid reservoir and the slit-shaped discharge port communicated with each other in correspondence to the coating liquid holding recess in the operation of applying the coating liquid to the surface of the coated object in the state where the pressure on the coating liquid in the coating liquid reservoir is regulated by feeding the gas into the coating liquid reservoir supplied with the predetermined amount of the coating liquid.
Figure 7D:
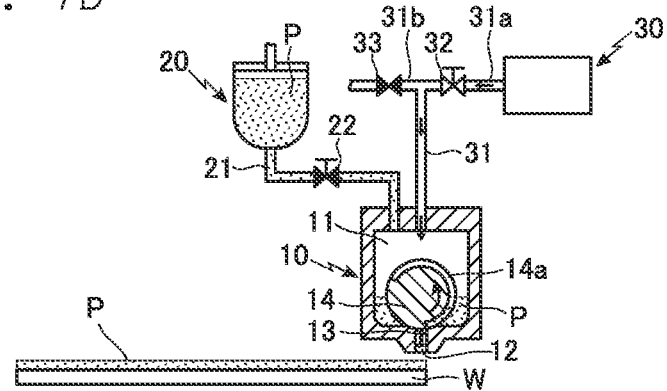
FIG. 7D is a schematic sectional illustration of the coating apparatus according to the first embodiment hereof, and shows a step of applying the coating liquid in the coating liquid reservoir to the surface of the coated object in the operation of applying the coating liquid to the surface of the coated object in the state where the pressure on the coating liquid in the coating liquid reservoir is regulated by feeding the gas into the coating liquid reservoir supplied with the predetermined amount of the coating liquid.
Figure 8A:
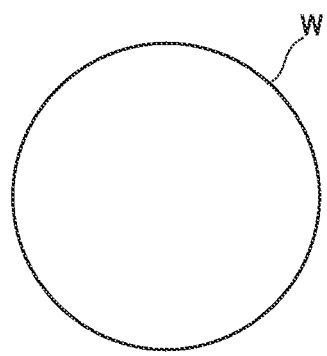
FIG. 8A is a schematic plan view of the coating apparatus according the first embodiment hereof, and corresponds to FIG. 7A, showing a part of how the coating liquid is applied to the surface of a circular coated object.
Figure 8B:
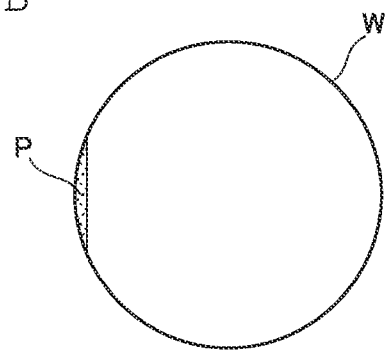
FIG. 8B is a schematic plan view of the coating apparatus according the first embodiment hereof, and corresponds to FIG. 7B, showing a part of how the coating liquid is applied to the surface of a circular coated object.
Figure 8C:
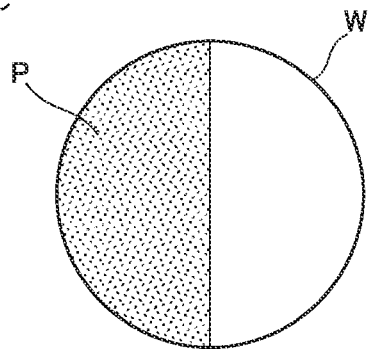
FIG. 8C is a schematic plan view of the coating apparatus according the first embodiment hereof, and corresponds to FIG. 7C, showing a part of how the coating liquid is applied to the surface of a circular coated object.
Figure 8D:
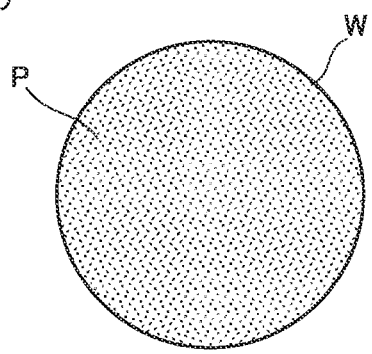
FIG. 8D is a schematic plan view of the coating apparatus according the first embodiment hereof, and corresponds to FIG. 7D, showing a part of how the coating liquid is applied to the surface of a circular coated object.

Subsequently, as shown in FIG. 7B to 7D, the coating liquid feeder 14 is rotated while moving the coated object W relative to the application nozzle 10. The coating liquid P held in the coating liquid holding recess 14a formed in the outer periphery of the coating liquid feeder 14 is allowed to flow to the slit-shaped discharge port 12 provided with the above-described corrugated partition member 13 via the coating liquid holding recess 14a. The coating liquid flows via an area where the coating liquid holding recess 14a is overlapped with the slit-shaped discharge port 12 of the application nozzle 10. The coating liquid is applied to the surface of the coated object W from the slit-shaped discharge port 12 through the discharge parts 12a at positions corresponding to the above-described coating liquid holding recess 14a. As shown in FIG. 8A to FIG. 8D, the coating liquid P held in the coating liquid holding recess 14a formed in the outer periphery of the coating liquid feeder 14 is circularly applied from the application nozzle 10 to the surface of the circular coated object W via the slit-shaped discharge port 12. In this embodiment, the coating apparatus of this embodiment can also be configured such that the coated object W is fixed at place while the application nozzle 10 is moved over the coated object W.

In the coating apparatus according to the first embodiment, the coating liquid holding recess 14a having an axially elongated elliptical shape is formed in the outer periphery of the cylindrical coating liquid feeder 14, as described above. Hence, the coating liquid P held in the coating liquid holding recess 14a formed in the outer periphery of the coating liquid feeder 14 as described above is circularly applied to the surface of the circular coated object W via the slit-shaped discharge port 12 of the application nozzle 10 as follows. The coated object W is moved at a speed higher than a circumferential speed at which the coating liquid feeder 14 is rotated. Thus, the coating liquid P in the coating liquid holding recess 14a shaped like the axially elongated ellipse is circularly applied to the surface of the circular coated object W via the slit-shaped discharge port 12.

This approach is advantageous in that to circularly apply the coating liquid P onto the surface of the circular coated object W, there is no need to form, in the outer periphery of the coating liquid feeder 14, a circular coating liquid holding recess 14a having a size corresponding to that of the coated object W. As described above, the coating liquid holding recess 14a is shaped like the axially elongated ellipse such that the coating liquid feeder 14 can be reduced in the diameter. This permits the downsizing of the application nozzle 10.

In the coating apparatus according to the first embodiment, the corrugated partition member 13 is disposed in the slit-shaped discharge port 12 of the application nozzle 10 along the longitudinal direction of the slit-shaped discharge port 12, thus longitudinally dividing the slit-shaped discharge port 12 into the multiple discharge parts 12a. The application nozzle 10 is adapted to feed the coating liquid P held in the coating liquid holding recess 14a to the surface of the coated object W only through the discharge parts 12a at positions corresponding to the coating liquid holding recess 14a. This is effective to prevent the coating liquid P from being drawn from the discharge parts 12a other than those corresponding to the coating liquid holding recess 14a and applied to the surface of the coated object W via those parts not corresponding to the coating liquid holding recess 14a. This method ensures that the coating liquid P is accurately applied to the surface of the coated object W in a shape corresponding to that of the coating liquid holding recess 14a. Furthermore, the coating liquid P applied to the surface of the coated object W is not increased in thickness of a circumferential area of the coating liquid P.

In the coating apparatus according to the first embodiment, the above-described corrugated partition member 13 is shorter than a length of the slit-shaped discharge port 12 with respect to the discharge direction of the slit-shaped discharge port 12 so that the longitudinally continuous slit-shaped discharge part 12b is provided at the distal end of the slit-shaped discharge port 12 with respect to the discharge direction. This is effective to prevent the problem that the individual flows of the coating liquid P as separated by the partition member 13 are directly applied to the surface of the coated object W, resulting in streaky coating irregularities.

According to the coating apparatus of the first embodiment, the coating liquid P held in the coating liquid holding recess 14a is applied to the surface of the coated object W via the discharge parts 12a at positions corresponding to the coating liquid holding recess 14a in the state where the pressure on the coating liquid P in the coating liquid reservoir 11 is so controlled to be at the given level. Therefore, the coating liquid P is applied to the whole surface of the coated object W in the uniform thickness.

Second Embodiment of Coating Apparatus

Next, a specific description is made on a coating apparatus according to a second embodiment hereof.

According to the coating apparatus of the second embodiment, the coating liquid P is fed from the unillustrated coating liquid feed device 20 to the coating liquid reservoir 11 in the application nozzle 10 via the coating liquid feed pipe 21, just as in the coating apparatus of the first embodiment.

In the coating apparatus according to the second embodiment, the coating liquid P is fed from the coating liquid feed device 20 to the coating liquid reservoir 11 in the application nozzle 10 via the coating liquid feed pipe 21 as follows. As shown in FIG. 9A and FIG. 9B, and FIG. 10A to FIG. 10D, a syringe pump 40 as coating liquid feed regulation means for regulating the feed of the coating liquid P is disposed at some midpoint of the coating liquid feed pipe 21 so as to ensure that a given pressure is applied to the coating liquid P stored in the coating liquid reservoir 11. The coating liquid P is led into the syringe pump 40 through a first coating liquid feed valve 22a disposed in the coating liquid feed pipe 21 on an upstream side of the syringe pump 40. Through a second coating liquid feed valve 22b disposed in the coating liquid feed pipe 21 on a downstream side of the syringe pump 40, the coating liquid P is fed into the coating liquid reservoir 11.

According to the second embodiment, for the purpose of allowing the coating liquid P to be fed into the coating liquid reservoir 11, the coating apparatus includes: an exhaust pipe 34 for exhausting the gas in the coating liquid reservoir 11 to the outside; and an exhaust valve 35 in the exhaust pipe 34.

Figure 9A:
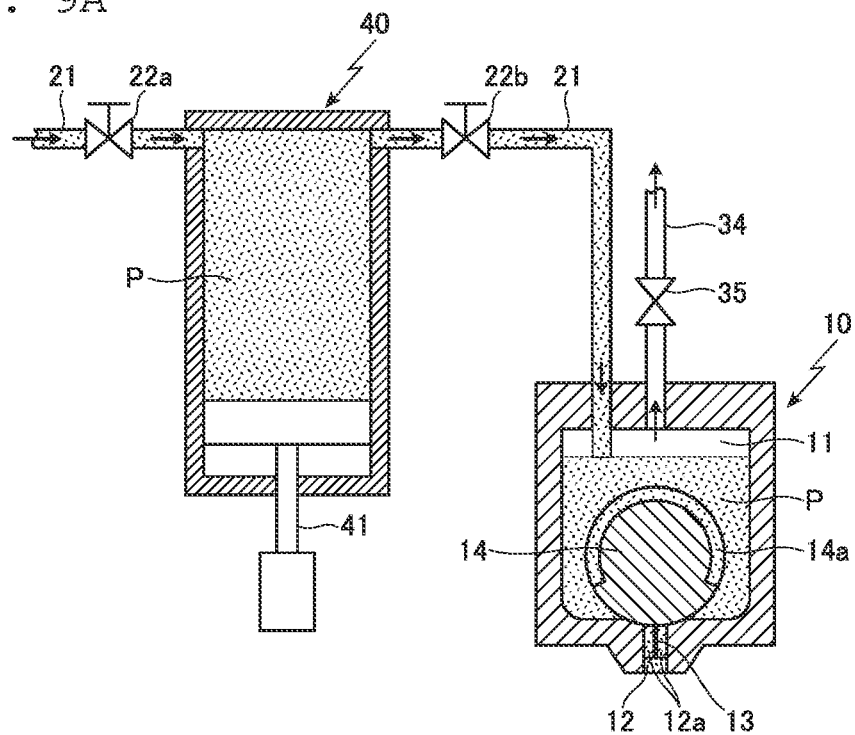
FIG. 9A is a schematic sectional illustration of a coating apparatus according to a second embodiment hereof, as seen in the direction intersecting with the longitudinal direction of the slit-shaped discharge port, showing how the coating liquid is fed into the coating liquid reservoir in a state where the slit-shaped discharge port of the application nozzle is closed with the portion of the coating liquid feeder that is not formed with the coating liquid holding recess.

According to the coating apparatus of the second embodiment, the coating liquid P is fed into the coating liquid reservoir 11 in the application nozzle 10 as follows. As shown in FIG. 9A, the slit-shaped discharge port 12 at the distal end of the application nozzle 10 is closed with the part of the coating liquid feeder 14 that is not formed with the coating liquid holding recess 14a. In this state, the first coating liquid feed valve 22a and the second coating liquid feed valve 22b, which are disposed in the coating liquid feed pipe 21, are opened to feed the coating liquid P into the syringe pump 40 through the coating liquid feed pipe 21. The coating liquid P thus fed to the syringe pump 40 is fed into the coating liquid reservoir 11 of the application nozzle 10. Furthermore, the exhaust valve 35 disposed in the exhaust pipe 34 is opened to evacuate the gas (gas purge) from the coating liquid reservoir 11 through the exhaust pipe 34, to which the coating liquid P is fed.

Figure 9B:
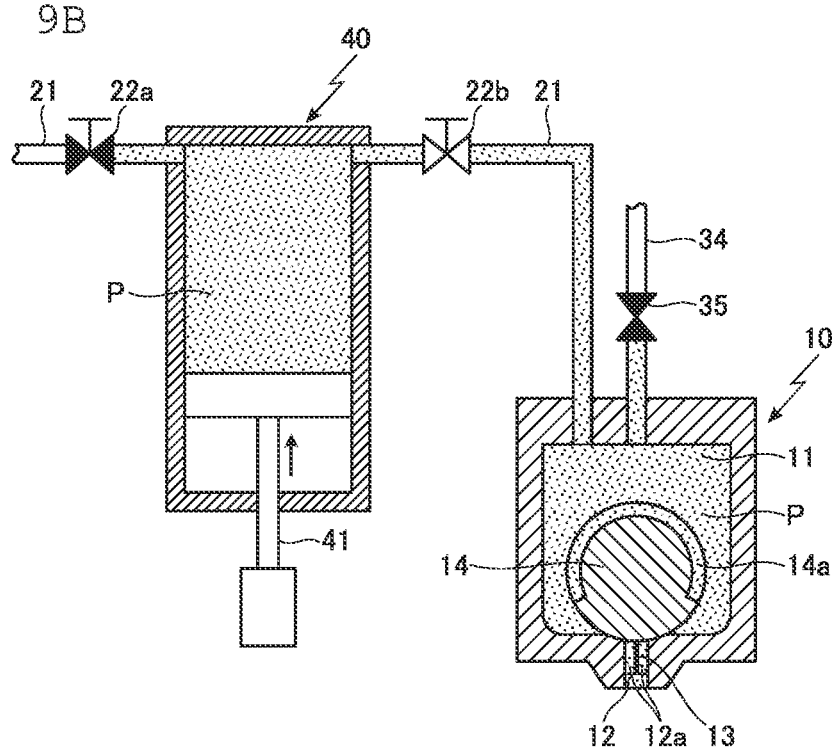
FIG. 9B is a schematic sectional illustration of the coating apparatus according to the second embodiment hereof, as seen in the direction intersecting with the longitudinal direction of the slit-shaped discharge port, showing how the feed of the coating liquid is regulated to maintain the pressure on the coating liquid filled in the coating liquid reservoir at the given level.

After the coating liquid P is filled in the coating liquid reservoir 11 by feeding the coating liquid P into the coating liquid reservoir 11 in the application nozzle 10, with the first coating liquid feed valve 22a and the exhaust valve 35 in the closed state as shown in FIG. 9B, the coating liquid P of the syringe pump 40 is pushed by a cylinder 41 of the syringe pump 40 in a direction to feed the coating liquid P from the syringe pump 40 into the coating liquid reservoir 11. It is ensured that the predetermined pressure is applied to the coating liquid P in the coating liquid reservoir 11. As to the open and close of the first coating liquid feed valve 22a, the second coating liquid feed valve 22b, and the exhaust valve 35, the blank mark indicates the open state, and the solid black mark indicates the closed state.

Figure 10A:
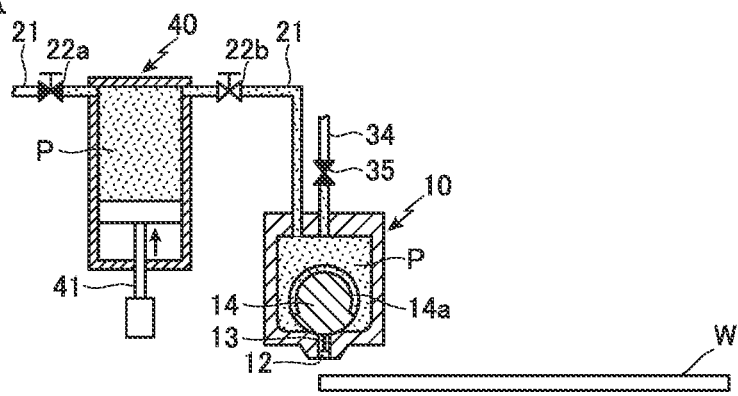
FIG. 10A is a schematic sectional illustration of the coating apparatus according to the second embodiment hereof, and shows a step of locating the application nozzle at place above the coated object in a state where the pressure on the coating liquid filled in the coating liquid reservoir is regulated to be at the given level by filling the coating liquid in the coating liquid reservoir.

According to the coating apparatus of the second embodiment, the above-described application nozzle 10 applies the coating liquid P onto the surface of the coated object W, as follows. The slit-shaped discharge part 12 at the distal end of the application nozzle 10 is closed by means of the part of the coating liquid feeder 14 that is not formed with the coating liquid holding recess 14a. The coating liquid P in the syringe pump 40 is pushed by the cylinder 41 of the syringe pump 40 in the direction to feed the coating liquid P of the syringe pump 40 into the coating liquid reservoir 11. Thus, the pressure on the coating liquid P in the coating liquid reservoir 11 is controlled to be at the predetermined level. In this state, as shown in FIG. 10A, the application nozzle 10 is moved to a position to start to apply the coating liquid P from the slit-shaped discharge port 12 onto the surface of the coated object W from the slit-shaped discharge port 12.

Figure 10B:
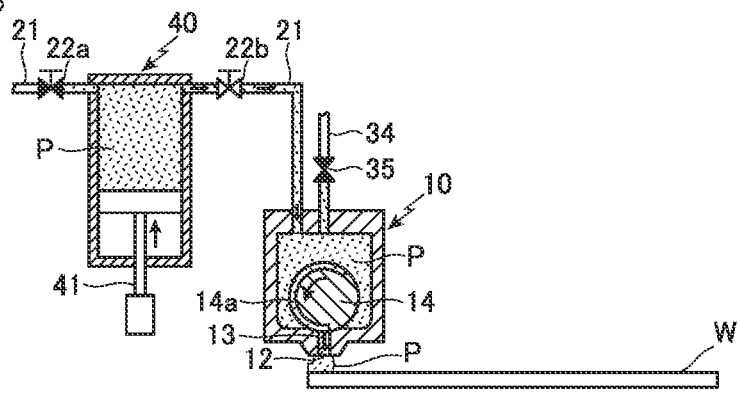
FIG. 10B is a schematic sectional illustration of the coating apparatus according to the second embodiment hereof, and showing a part of steps of rotating the coating liquid feeder while moving the coated object under the application nozzle, so as to bring the coating liquid holding recess elliptically formed in the outer periphery of the coating liquid feeder to place above the slit-shaped discharge port; and applying the coating liquid in the coating liquid reservoir to the surface of the coated object by allowing the coating liquid to flow to the discharge parts through a communication between the coating liquid reservoir and the slit-shaped discharge port mutually communicated in correspondence to the coating liquid holding recess.
Figure 10C:
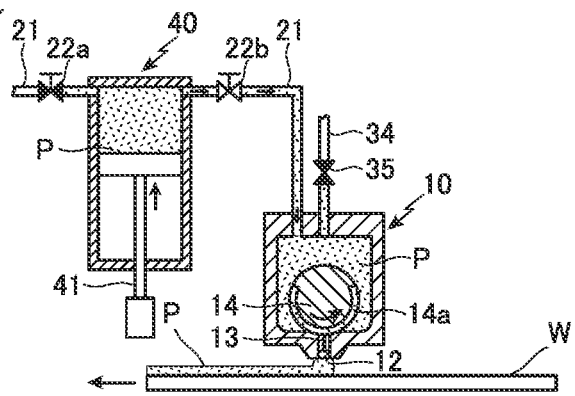
FIG. 10C is a schematic sectional illustration of the coating apparatus according to the second embodiment hereof, and showing a part of the steps of rotating the coating liquid feeder while moving the coated object under the application nozzle, so as to bring the coating liquid holding recess elliptically formed in the outer periphery of the coating liquid feeder to place above the slit-shaped discharge port; and applying the coating liquid in the coating liquid reservoir to the surface of the coated object by allowing the coating liquid to flow to the discharge parts through the communication between the coating liquid reservoir and the slit-shaped discharge port mutually communicated in correspondence to the coating liquid holding recess.
Figure 10D:
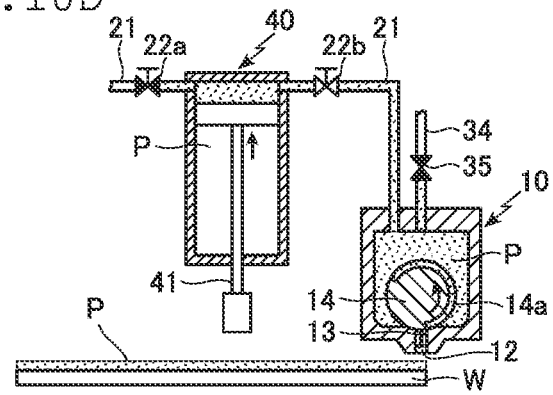
FIG. 10D is a schematic sectional illustration of the coating apparatus according to the second embodiment hereof, and showing a part of the steps of rotating the coating liquid feeder while moving the coated object under the application nozzle, so as to bring the coating liquid holding recess elliptically formed in the outer periphery of the coating liquid feeder to place above the slit-shaped discharge port; and applying the coating liquid in the coating liquid reservoir to the surface of the coated object by allowing the coating liquid to flow to the discharge parts through the communication between the coating liquid reservoir and the slit-shaped discharge port mutually communicated in correspondence to the coating liquid holding recess.

Subsequently, as shown in FIG. 10B to FIG. 10D, the coating liquid feeder 14 is rotated while moving the coated object W relative to the application nozzle 10. The coating liquid P held in the coating liquid holding recess 14a formed in the outer periphery of the coating liquid feeder 14 is allowed to flow to the slit-shaped discharge port 12 provided with the above-described corrugated partition member 13 via the coating liquid holding recess 14a. The coating liquid flows via an area where the coating liquid holding recess 14a is overlapped with the slit-shaped discharge port 12 of the application nozzle 10. The coating liquid is applied to the surface of the coated object W from the slit-shaped discharge port 12 through the discharge parts 12a at positions corresponding to the above-described coating liquid holding recess 14a. Just as in the case of the coating apparatus of the first embodiment shown in FIG. 8A to FIG. 8D, the coating liquid P held in the coating liquid holding recess 14a formed in the outer periphery of the coating liquid feeder 14 is circularly applied from the application nozzle 10 to the surface of the circular coated object W via the slit-shaped discharge port 12. Just as in the case of the coating apparatus of the first embodiment, the coating apparatus of this embodiment can also be configured such that the coated object W is fixed at place while the application nozzle 10 is moved over the coated object W.

In a case where the coating liquid P in the syringe pump 40 runs low as a result of the application of the coating liquid P to the surface of the coated object W in the above-described manner, the above-described second coating liquid feed valve 22b is closed while the above-described first coating liquid feed valve 22a is opened. Meanwhile, the syringe pump 40 is operated in a suction direction so as to fill the coating liquid P in the syringe pump again via the coating liquid feed pipe 21. The above drawings of the coating apparatus of the second embodiment illustrate that the coating liquid P in the syringe pump 40 runs out in one coating operation. Normally, however, the coating liquid P is filled in the syringe pump after multiple coating processes.

According to the coating apparatus of the second embodiment, as well, the coating liquid holding recess 14a having an axially elongated elliptical shape is formed in the outer periphery of the cylindrical coating liquid feeder 14, as described above. Hence, the coating liquid P held in the coating liquid holding recess 14a formed in the outer periphery of the coating liquid feeder 14 as described above is circularly applied to the surface of the circular coated object W via the slit-shaped discharge port 12 of the application nozzle 10, as follows. Just as in the coating apparatus of the first embodiment, the coated object W is moved at a speed higher than a circumferential speed at which the coating liquid feeder 14 is rotated. Thus, the coating liquid P in the coating liquid holding recess 14a shaped like the axially elongated ellipse is circularly applied to the surface of the circular coated object W via the slit-shaped discharge port 12.

This approach is advantageous in that to circularly apply the coating liquid P onto the surface of the circular coated object W, there is no need to form, in the outer periphery of the coating liquid feeder 14, a circular coating liquid holding recess 14a having a size corresponding to that of the coated object W. As described above, the coating liquid holding recess 14a is shaped like the axially elongated ellipse such that the coating liquid feeder 14 can be reduced in the diameter. This permits the downsizing of the application nozzle 10.

According to the coating apparatus of the second embodiment, as well, the corrugated partition member 13 is disposed in the slit-shaped discharge port 12 of the application nozzle 10 along the longitudinal direction of the slit-shaped discharge port 12, thus longitudinally dividing the slit-shaped discharge port 12 into the multiple discharge parts 12a. The application nozzle 10 is adapted to feed the coating liquid P held in the coating liquid holding recess 14a to the surface of the coated object W only through the discharge parts 12a at positions corresponding to the coating liquid holding recess 14a. Just as in the coating apparatus of the first embodiment, this is effective to prevent the coating liquid P from being drawn from the discharge parts 12a other than those corresponding to the coating liquid holding recess 14a and applied to the surface of the coated object W via those parts not corresponding to the coating liquid holding recess 14a. This method ensures that the coating liquid P is accurately applied to the surface of the coated object W in a shape corresponding to that of the coating liquid holding recess 14a. Furthermore, the coating liquid P applied to the surface of the coated object W is not increased in thickness of a circumferential area of the coating liquid P.

Figure 12:
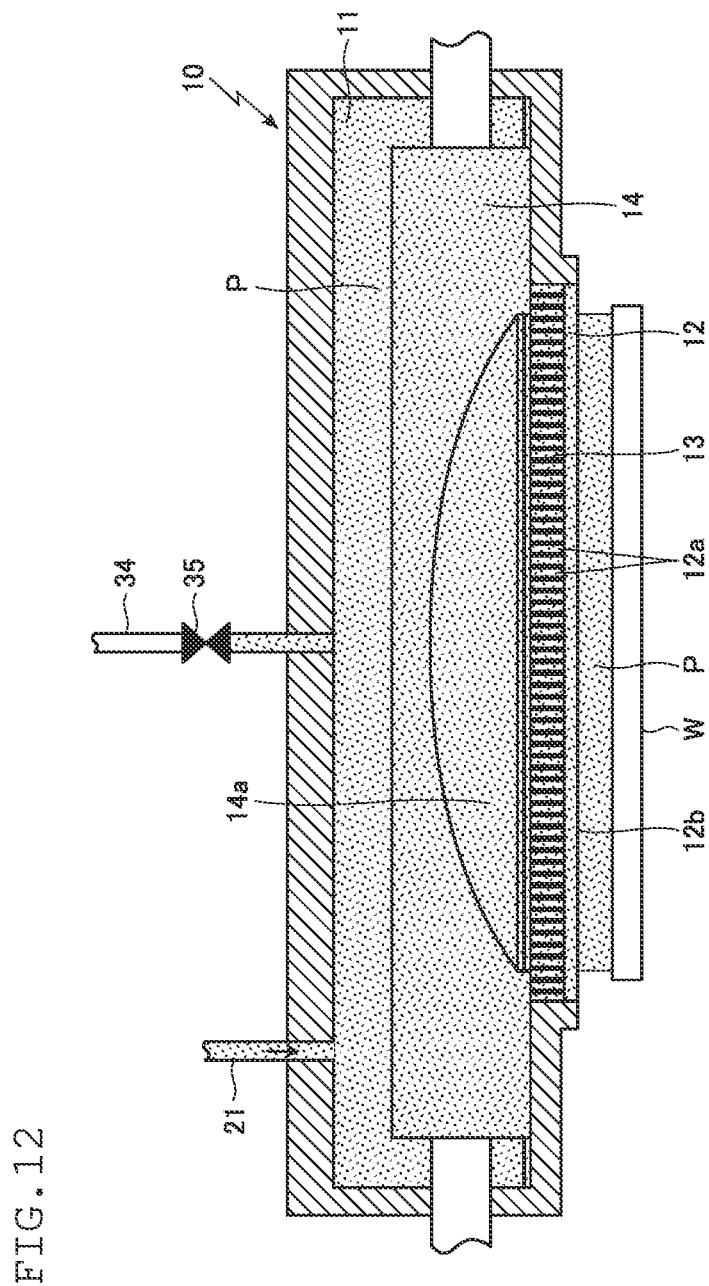
FIG. 12 is a schematic longitudinal sectional illustration of the application nozzle according to the second embodiment hereof, showing the state corresponding to FIG. 10C when the coating liquid feeder is rotated to bring the coating liquid holding recess to place above the slit-shaped discharge port, thus allowing the coating liquid to flow to the discharge parts through the communication between the coating liquid holding recess and the slit-shaped discharge part, thus applying the coating liquid in the coating liquid reservoir to the surface of the coated object.

FIG. 12 is a schematic longitudinal sectional view of the application nozzle 10 for illustrating a case where, as shown in FIG. 10C, the coating liquid P held in the coating liquid holding recess 14 is allowed to flow via the coating liquid holding recess 14 to the slit-shaped discharge port 12 provided with the above-described corrugated partition member 13 as described above. The coating liquid P is applied to the surface of the coated object W via the discharge parts 12a at positions corresponding to the coating liquid holding recess 14a. In this case, the slit-shaped discharge port 12 is longitudinally divided into the multiple discharge parts 12a by the above-described corrugated partition member 13. This is effective to prevent the problem that the coating liquid P is drawn through the discharge parts 12a other than those at positions corresponding to the coating liquid holding recess 14a and is applied to the surface of the coated object W via parts not corresponding to the coating liquid holding recess 14a. A problem that the coating liquid applied to the surface of the coated object W is increased in thickness at a circumferential part of the coated area.

In the coating apparatus of the second embodiment, as well, the above-described corrugated partition member 13 is shorter than the length of the slit-shaped discharge port 12 with respect to the discharge direction of the slit-shaped discharge port 12 so that the longitudinally continuous slit-shaped discharge part 12b is provided at the distal end of the slit-shaped discharge port 12 with respect to the discharge direction. This is effective to prevent the problem that the individual flows of the coating liquid P as separated by the partition member 13 are directly applied to the surface of the coated object W, resulting in streaky coating irregularities.

In the coating apparatus of the second embodiment, as well, the coating liquid P held in the coating liquid holding recess 14a is applied to the surface of the coated object W via the discharge parts 12a at positions corresponding to the coating liquid holding recess 14a in the state where the pressure on the coating liquid P in the coating liquid reservoir 11 is so controlled to be at the given level. Therefore, the coating liquid P is applied to the whole surface of the coated object W in the uniform thickness.

Figure 11A:
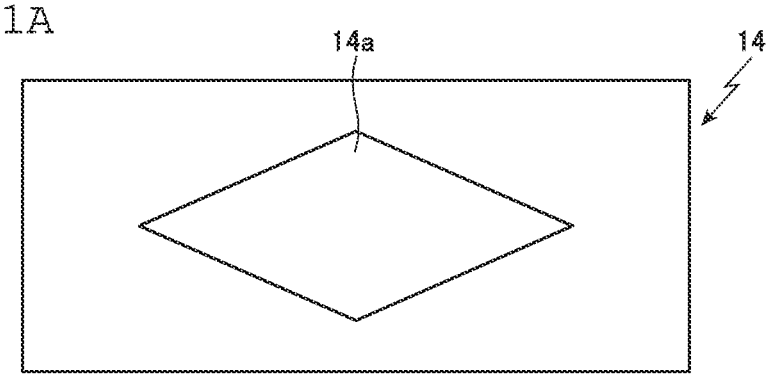
FIG. 11A is a developed view showing one of a plurality of exemplary modifications of the configuration of the coating liquid holding recess which holds the coating liquid in the outer periphery of the coating liquid feeder of the coating apparatus according to the above embodiment.
Figure 11B:
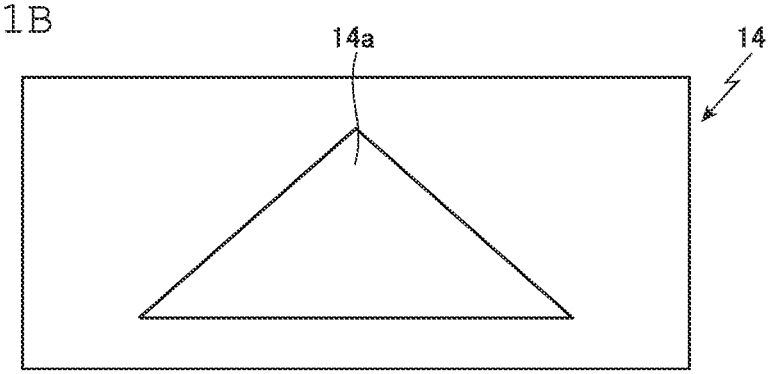
FIG. 11B is a developed view showing one of the plurality of the exemplary modifications of the configuration of the coating liquid holding recess which holds the coating liquid in the outer periphery of the coating liquid feeder of the coating apparatus according to the above embodiment.
Figure 11C:
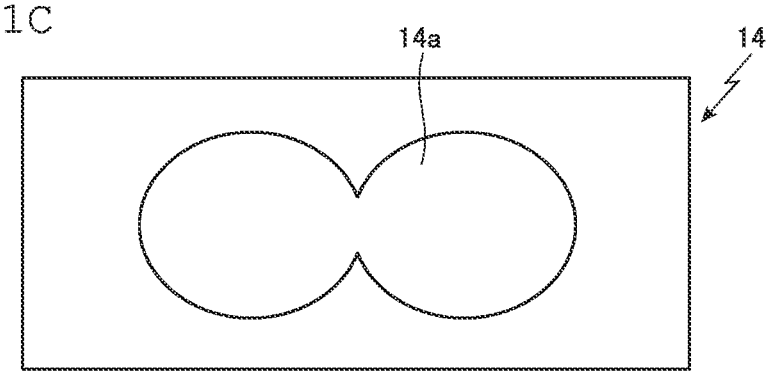
FIG. 11C is a developed view showing one of the plurality of the exemplary modifications of the configuration of the coating liquid holding recess which holds the coating liquid in the outer periphery of the coating liquid feeder of the coating apparatus according to the above embodiment.

According to the coating apparatus of the first and second embodiments, the coating liquid holding recess 14a shaped like the axially elongated ellipse is formed in the outer periphery of the cylindrical coating liquid feeder 14. As shown in FIG. 7A to FIG. 7D, the coating liquid P held in the coating liquid holding recess 14a formed in the outer periphery of the coating liquid feeder 14 is circularly applied to the surface of the circular coated object W via the slit-shaped discharge port 12 of the application nozzle 10. However, the shape of the coated object W is not particularly limited to circle. Further, the configuration of the coating liquid holding recess 14a formed in the outer periphery of the coating liquid feeder 14 is not also limited. The coating liquid feeder is adapted for the application of the coating liquid P to the surface of the coated object W via the slit-shaped discharge port 12 of the application nozzle. Depending upon a product to be coated with the coating liquid P, for example, the coating liquid holding recess 14a formed in the outer periphery of the coating liquid feeder 14 can be formed in any of various shapes such as diamond shape, triangle shape, and gourd-shape, as shown in FIG. 11A, FIG. 11B and FIG. 11C.

REFERENCE SIGNS LIST

10: application nozzle
11: coating liquid reservoir
12: slit-shaped discharge port
12a: discharge part
12b: continuous slit-shaped discharge part
13: partition member
13X: partition member
13Y: partition member
14: coating liquid feeder
14a: coating liquid holding recess
20: coating liquid feed device
21: coating liquid feed pipe
22: coating liquid feed valve
22a: first coating liquid feed valve
22b: second coating liquid feed valve
30: gas feed device
31: feed/exhaust pipe
31a: feed side pipe
31b: exhaust side pipe
32: gas feed regulation valve
33: exhaust valve
34: exhaust pipe
35: exhaust valve
40: syringe pump
41: cylinder
P: coating liquid
W: coated object

What is claimed is:

1. A coating apparatus discharging a coating liquid to a coated object, comprising:
a coating liquid reservoir that has an internal tank and stores the coating liquid in the internal tank; and
an application nozzle that has a slit-shaped discharge port disposed at a distal end of the application nozzle and discharges the coating liquid from the internal tank of the coating liquid reservoir, wherein the slit-shaped discharge port is located at a place above the coated object, extending in a longitudinal direction of the slit-shaped discharge port, a relative movement between the application nozzle and the coated object is caused to apply the coating liquid to a surface of the coated object via the slit-shaped discharge port, the coating liquid reservoir has a coating liquid feeder that is in a hollow and cylindrical shape for holding the coating liquid therein, the coating liquid feeder is configured to extend along and to rotate around an axis of the cylindrical shape, and is disposed in the coating liquid reservoir in a manner to be located at a place above the slit-shaped discharge port and the axis of the cylindrical shape is parallel to the longitudinal direction of the slit-shaped discharge port, an outer periphery of the coating liquid feeder is formed with a coating liquid holding recess having a predetermined cut-off pattern such that the coating liquid inside the coating liquid feeder is fed via the coating liquid holding recess while the coating liquid feeder rotates, the internal tank of the coating liquid reservoir has a width with respect to a width direction, which is perpendicular to the longitudinal direction of the slit-shaped discharge port and to a vertical direction, wherein the width of the internal tank at its bottom is larger than a diameter of the outer periphery of the coating liquid feeder such that the coating liquid feeder is configured to be fully submerged under the coating liquid when a predetermined amount of the coating liquid is held in the internal tank, a partition member for dividing the slit-shaped discharge port into plural discharge parts along the longitudinal direction of in the slit-shaped discharge port is disposed, wherein the partition member has a continuous wave pattern so that each of the plural discharge parts are alternately arranged in turn on either side of the slit-shaped discharge port with respect to the width direction, while causing the relative movement between the coated object and the application nozzle, the coating liquid feeder with the coating liquid holding recess holding the coating liquid therein is rotated around the axis in the coating liquid reservoir, so that the coating liquid held in the coating liquid feeder is discharged to the surface of the coated object via some discharge parts at positions corresponding to the coating liquid holding recess moved to the slit-shaped discharge port of the application nozzle, and thus, the coating liquid is applied to the surface of the coated object in a manner to correspond to a shape of the coating liquid holding recess, and a length of the partition member is shorter than that of the slit-shaped discharge port with respect to a discharge direction of the slit-shaped discharge port in which the coating liquid is discharged from the slit-shaped discharge port such that a distal edge of the partition member does not reach a distal edge of the slit-shaped discharge port, creating a single longitudinally continuous hollow space between the distal edge of the partition member and the distal edge of the slit-shaped discharge port.

2. The coating apparatus according to claim 1, further comprising a pressure regulator for regulating the pressure on the coating liquid in the coating liquid reservoir, wherein
with the pressure on the coating liquid in the coating liquid reservoir maintained to be at a given level by means of the pressure regulator, the coating liquid feeder is rotated to discharge the coating liquid held in the coating liquid holding recess to the surface of the coated object via the discharge parts at positions corresponding to the coating liquid holding recess.

3. The coating apparatus according to claim 2, wherein a gas feed regulation valve as the pressure regulator is disposed in a feed side pipe for feeding a gas from a gas feed device to the coating liquid reservoir so that the pressure on the coating liquid in the coating liquid reservoir is regulated to be at the given level.

4. The coating apparatus according to claim 1, wherein the coating liquid holding recess of an axially elongated elliptical shape is formed in the outer periphery of the coating liquid feeder, and
the coating liquid is circularly applied to the surface of the coated object by regulating a movement speed at which the coated object is moved relative to the application nozzle to be at a higher level than a circumferential speed at which the coating liquid feeder is rotated.

5. The coating apparatus according to claim 1, wherein the internal tank of the coating liquid reservoir has a pair of side walls separated in the width direction by the width and a height with respect to the discharge direction, wherein the height of the internal tank at the side walls is larger than the diameter of the outer periphery of the coating liquid feeder.

6. The coating apparatus according to claim 1, wherein the discharge direction of the slit-shaped discharge port is parallel to the vertical direction.

7. A coating method which uses the coating apparatus according to claim 1 and which includes the steps of: feeding the coating liquid into the coating liquid reservoir in a state where the slit-shaped discharge port at the distal end of the application nozzle is closed with a part of the coating liquid feeder that is not formed with the coating liquid holding recess of the coating liquid feeder rotatably disposed in the coating liquid reservoir; allowing the coating liquid holding recess to hold some coating liquid therein, the coating liquid holding recess formed in the outer periphery of the coating liquid feeder in the predetermined pattern shape, the coating liquid feeder rotatably disposed in the coating liquid reservoir; causing the relative movement between the application nozzle and the coated object while rotating the coating liquid feeder in the coating liquid reservoir along with the coating liquid holding recess holding some coating liquid therein; allowing the coating liquid holding recess to discharge the coating liquid of the coating liquid holding recess onto the surface of the coated object via the discharge parts brought to place corresponding to the slit-shaped discharge port of the application nozzle; and thus applying the coating liquid to the surface of the coated object according to the shape of the coating liquid holding recess.

* * * * *